United States Patent
Tsuburaya (10) Patent No.: US 9,524,640 B2
(45) Date of Patent: Dec. 20, 2016

(54) TRAFFIC SIMULATION SYSTEM AND TRAFFIC SIMULATION PROGRAM

(75) Inventor: Shinichi Tsuburaya, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 382 days.

(21) Appl. No.: 13/643,242

(22) PCT Filed: Apr. 28, 2011

(86) PCT No.: PCT/JP2011/060383
§ 371 (c)(1),
(2), (4) Date: Oct. 24, 2012

(87) PCT Pub. No.: WO2011/142271
PCT Pub. Date: Nov. 17, 2011

(65) Prior Publication Data
US 2013/0041642 A1    Feb. 14, 2013

(30) Foreign Application Priority Data

May 12, 2010  (JP) .................................. 2010-110147

(51) Int. Cl.
  *G06F 17/50*    (2006.01)
  *G08G 1/01*     (2006.01)
  (Continued)

(52) U.S. Cl.
  CPC ......... *G08G 1/0104* (2013.01); *G06F 17/5009* (2013.01); *G01C 21/34* (2013.01);
  (Continued)

(58) Field of Classification Search
  None
  See application file for complete search history.

(56) References Cited

U.S. PATENT DOCUMENTS 5,444,442 A *  8/1995  Sadakata et al. .............. 340/916
6,813,555 B1 * 11/2004  Kerner .......................... 701/117
(Continued)

FOREIGN PATENT DOCUMENTS

DE    101 08 611 A1    9/2002
DE    101 11 261 A1    9/2002
(Continued)

OTHER PUBLICATIONS

J. Holtzman, et al "A Vehicular Traffic GIS and Simulator for Route Guidance on NY/NJ Highways," IEEE IEE Vehicle Navigation & Information Systems Conference, Ottawa Canada, 1993, 6 pages.*

(Continued)

*Primary Examiner* — Aniss Chad
*Assistant Examiner* — David M Rogers
(74) *Attorney, Agent, or Firm* — Westerman, Hattori, Daniels & Adrian, LLP (57) ABSTRACT

In a traffic simulation in which vehicle models, which simulate vehicles, are moved in a road system model including links, which simulate the smallest segment of roads divided by intersections, etc., and nodes, which simulate the intersections, turning points of the roads, etc., the presence/absence of an entering vehicle model that enters a different link from a link in the road system model via the node is judged; the velocity of the entering vehicle model after entering the different link is calculated on the basis of the density of the vehicle models in the different link after the entering vehicle model has entered the different link; and the calculated velocity is set only for the entering vehicle model that has entered the different link.

4 Claims, 10 Drawing Sheets

(51) Int. Cl.
*G01C 21/34* (2006.01)
*H04W 40/02* (2009.01)
*H04W 40/20* (2009.01)
*H04W 40/28* (2009.01)

(52) U.S. Cl.
CPC ....... *G01C 21/3415* (2013.01); *H04W 40/026* (2013.01); *H04W 40/20* (2013.01); *H04W 40/28* (2013.01)

(56) References Cited

U.S. PATENT DOCUMENTS

2004/0088392 A1* 5/2004 Barrett et al. ................ 709/223
2008/0319639 A1 12/2008 Yamane

FOREIGN PATENT DOCUMENTS

| JP | 08-249586 A | 9/1996 |
| JP | 10-222791 A | 8/1998 |
| JP | 10-256981 A | 9/1998 |
| JP | 10-334389 A | 12/1998 |
| JP | 2875520 B2 | 3/1999 |
| JP | 11-144182 A | 5/1999 |
| JP | 2003-162794 A | 6/2003 |
| JP | 3485774 B2 | 1/2004 |
| JP | 2008-046955 A | 2/2008 |
| JP | 4074084 B2 | 4/2008 |

OTHER PUBLICATIONS

D.S. Lee et al., "Bandwidth Reservation Scheme Based on Road Information for Next Generation Cellular Networks," IEEE Transactions on Vehicular Technology, vol. 53, No. 1, Jan. 2004, pp. 243-252.*

O.K. Tonguz, et al., "Modeling Urban Traffic: A Cellular Automata Approach," IEEE Communications Magazine, May 2009, pp. 142-150.*

T. Kiesling, et al. "Towards Time-Parallel Road Traffic Simulation," Proceeding of the Workshop on Principles of Advanced and Distributed Simulation, IEEE, 2005, 9 pages.*

I. Zohdy, "Modeling Permissive Left-Turn Gap Acceptance Behavior at Signalized Intersections," Masters Degree Thesis, Virginia Polytechnic Institute and State University, Nov. 13, 2009, 117 pages.*

C. Kemper, "Dynamic Traffic Flow Model—A New Approach with Static Data," Proceedings of the 5th European Congress and Exhibition on Intelligent Transport Systems (ITS), 2005, pp. 1-13.*

K. Nagel, "Traffic networks." Handbook on Networks (2002).*

K. Nagel, et al., "TRANSIMS traffic flow characteristics," 77th annual TRB meeting, Transportation Research Board, 1998, 47 pages.*

K. Nagel, et al., "Still Flowing: Approaches to Traffic Flow and Traffic Jam Modeling," Operations Research, vol. 51, No. 5, Sep.-Oct. 2003, pp. 681-710.*

T. Ishikawa, "Development of a Road Traffic Simulator," IEEE Transactions on Vehicular Technology, vol. 47, No. 3, Aug. 1998, pp. 1066-1071.*

G. Newell, "Nonlinear Effects in the Dynamics of Car Following," Operations Research, vol. 9, No. 2, 1961, pp. 209 229.*

A Decision to Grant a Patent dated Dec. 10, 2013, in corresponding Japanese Application No. 2010-110147 w/ English Concise Statement. (4 pages).

Extended European Search Report "EESR" dated Mar. 6, 2014, issued in European Patent Application No. 11780528.3.

International Search Report of PCT/JP2011/060383, mailing date of May 31, 2011, w/ English translation.

Written Opinion of PCT/JP2011/060383, mailing date of May 31, 2011, w/ English translation.

Decision to Grant a Patent dated Oct. 7, 2014, issue for European Application 11780528.3. "The Decision to Grant a Patent has been received." (7 pages).

Decision to Grant a European Patent Pursuant to Article 97(1) EPC dated Jan. 29, 2015, issued in corresponding European Patent Application No. 11780528.3 (2 pages) "The Decision to Grant a Patent has been received".

* cited by examiner

TRAFFIC SIMULATION SYSTEM AND TRAFFIC SIMULATION PROGRAM

TECHNICAL FIELD

The present invention relates to a traffic simulation system and a traffic simulation program.

BACKGROUND ART

Methods of predicting vehicle movements on roads by computer simulations mainly include macroscopic methods and microscopic methods.

In the macroscopic methods, the time required for vehicles to pass through roads, a presence or an absence of congestion, and so forth are predicted from a relationship between a traffic volume (number of vehicles that can pass through per unit time) determined by speed limits, numbers of lanes, road widths, and so forth and traffic demand (number of vehicle for which usage is expected per unit time). The macroscopic methods that predict vehicle movements with such an approach are capable of predicting traffic conditions in a wide area in a short calculation time.

However, because the macroscopic methods do not separately track the behaviors of individual vehicles, it is not possible to focus on a specific vehicle and to predict traveling time required for the traveling distance, etc. for each vehicle. In addition, because simulations are performed assuming that vehicle densities on roads are uniform, there is a problem in that an increase and a decrease in vehicle density occurring in the rear affects traveling velocities of vehicles in the front.

In contrast, because the microscopic methods separately track the behaviors of individual vehicles, the above-described problem that traveling time cannot be separately predicted for the individual vehicles is eliminated. In addition, in the microscopic methods, because vehicle velocities for the individual vehicles are calculated from situations in the surroundings, such as the distance to an intersection, the behaviors of vehicles in front, and so forth, the problem that an increase and a decrease in the vehicle density occurring in the rear affects traveling velocities of vehicles in the front is eliminated.

However, because the microscopic methods separately analyze the behaviors of individual vehicles, the amount of calculation as a whole is large, and there is a problem in that a long calculation time is required.

Therefore, Patent Literature 1 discloses a traffic-flow simulator in which links, which are road models simulating roads, are divided into a plurality of blocks, and vehicle movements are calculated for each block, thereby improving the simulation speed.

CITATION LIST

Patent Literature

{PTL 1} Japanese Unexamined Patent Application, Publication No. Hei 10-334389

SUMMARY OF INVENTION

Technical Problem

However, with the traffic-flow simulator disclosed in Patent Literature 1, because the simulation is performed on the basis of road models divided into the plurality of blocks, which are models that are not consistent with real roads, a divergence from reality occurs.

The present invention has been conceived in light of the above-described circumstances, and an object thereof is to provide a traffic simulation system and a traffic simulation program with which the divergence between reality and a simulation can be reduced and the time required for performing the simulation can be reduced.

Solution to Problem

In order to solve the above-described problems, a traffic simulation system of the present invention employs the following solutions.

Specifically, a traffic simulation system according to a first aspect of the present invention is a traffic simulation system in which vehicle models, which simulate vehicles, are moved in a road system model that simulates a road system including a plurality of roads and intersections that connect the roads, the traffic simulation system including a judging unit for judging a presence or an absence of an entering vehicle model, which is the vehicle model that enters from a road in the road system model to a different road thereof via an intersection; a calculating unit for calculating a velocity after entering the different road for the entering vehicle model that has been judged by the judging unit to be entering the different road on the basis of a density of the vehicle models in the different road after the entering vehicle model has entered the different road; and a setting unit for setting the velocity calculated by the calculating unit only for the entering vehicle model that has entered the different road.

With the first aspect of the present invention, the judging unit judges the presence/absence of the entering vehicle model, which is a vehicle model that enters the different road from the road in the road system model via the intersection; the calculating unit calculates the velocity of the entering vehicle model after entering the different road on the basis of the density of the vehicle models in the different road after the entering vehicle model has entered the different road; and the setting unit sets the velocity calculated with the calculating unit only for the entering vehicle model that has entered the different road.

Because the velocity of the entering vehicle model that enters the different road is calculated on the basis of the density of the vehicle models in the different road in this way instead of calculating it from velocities of the individual vehicle models, the time required for calculating the velocity of the entering vehicle model is short. In addition, because the velocities of other vehicle models positioned in the different road are not changed even if the entering vehicle model enters the different road, the divergence between reality and the simulation is small.

Based on these features, with the first aspect of the present invention, the divergence between reality and a simulation can be reduced, and the time required for the simulation can be reduced.

The traffic simulation system according to the first aspect of the present invention is additionally provided with an entry-origin-velocity calculating unit for calculating velocities of the vehicle models in an entry-origin road for the entering vehicle model after the entering vehicle model has entered the different road, on the basis of density of the vehicle models in the entry-origin road; and an entry-origin-velocity setting unit for setting the velocity calculated with the entry-origin-velocity calculating unit for the vehicle models in the entry-origin road after the entering vehicle model has entered the different road.

With the first aspect of the present invention, the entry-origin-velocity calculating unit calculates the velocities of the vehicle models in the entry-origin road for the entering vehicle model after the entering vehicle model has entered the different road, on the basis of the density of the vehicle models in the entry-origin road; and the entry-origin-velocity setting unit sets the calculated velocities for the vehicle models in the entry-origin road after the entering vehicle model has entered the different road.

Because the velocities of the vehicle models in the entry-origin roads are calculated on the basis of an increase and a decrease in the density of the vehicle models, the time required for calculating the velocities of the vehicle models in the entry-origin road is short.

The traffic simulation system according to the first aspect of the present invention is additionally provided with a cross-lane-turn judging unit for judging, when the judging unit judges that there is an entering vehicle model, whether or not the entering vehicle model is a cross-lane-turning vehicle which makes a cross-lane-turn in order to enter the different road; and a determining unit for determining, when the cross-lane-turn judging unit judges that the entering vehicle model is a cross-lane-turning vehicle, a possibility for the entering vehicle model to make the cross-lane-turn on the basis of density and velocity of the vehicle models that act as oncoming vehicles in the road where the entering vehicle model is positioned.

With the first aspect of the present invention, the cross-lane-turn judging unit judges whether or not the entering vehicle model is a cross-lane-turning vehicle which makes a cross-lane-turn to enter the different road; and the determining unit determines the possibility for the entering vehicle model to make the cross-lane-turn on the basis of the density and the velocities of the vehicle models that act as the oncoming vehicles in the road where the entering vehicle model is positioned.

Because the possibility for the entering vehicle model to make a cross-lane-turn is determined on the basis of the density and the velocities of the vehicle models that act as the oncoming vehicles in the road where the entering vehicle model is positioned, the divergence between reality and the simulation can be reduced when the entering vehicle model makes a cross-lane-turn.

Furthermore, the traffic simulation system according to the first aspect of the present invention is additionally provided with a random-number generating unit for generating a random number, wherein the determining unit permits the entering vehicle model to make a cross-lane-turn on the basis of a result of comparisons between a value of the random number generated with the random-number generating unit and a value based on the density and the velocity of the vehicle models that act as the oncoming vehicles.

With the first aspect of the present invention, the random-number generating unit generates a random number; and the determining unit permits the entering vehicle model to make the cross-lane-turn on the basis of results of the comparison, performed by the determining unit, of the value of the random number generated by the random-number generating unit and the value based on the density and the velocities of the vehicle models that act as the oncoming vehicles.

For example, if the value based on the density and the velocities of the vehicle models that act as the oncoming vehicles is larger than the value of the random number, the cross-lane-turn is permitted. Because the possibility of a cross-lane-turn is determined by using the random number in this way, the processing for determining the possibility of a cross-lane-turn can be simplified.

In addition, in order to solve the problems, a traffic simulation program of the present invention employs the following solutions Specifically, a traffic simulation program according to a second aspect of the present invention is a traffic simulation program employed in a traffic simulation system in which vehicle models, which simulate vehicles, are moved in a road system model that simulates a road system including a plurality of roads and intersections that connect the roads, the program causing a computer to function as a judging unit for judging a presence or an absence of an entering vehicle model, which is the vehicle model that enters from a road in the road system model to a different road thereof via an intersection; a calculating unit for calculating a velocity after entering the different road for the entering vehicle model that has been judged by the judging unit to be entering the different road on the basis of a density of the vehicle models in the different road after the entering vehicle model has entered the different road; and a setting unit for setting the velocity calculated by the calculating unit only for the entering vehicle model that has entered the different road.

Because the velocity of the entering vehicle model that enters the different road is calculated on the basis of the density of the vehicle models in the different road in this way instead of calculating it from velocities of the individual vehicle models, the time required for calculating the velocity of the entering vehicle model is short. In addition, because the velocities of other vehicle models positioned in the different road are not changed even if the entering vehicle model enters the different road, the divergence between reality and the simulation is small.

Based on these features, with the present invention, the divergence between reality and the simulation can be reduced, and time required for the simulation can be reduced.

Advantageous Effects of Invention

A divergence between reality and a simulation can be reduced, and time required for the simulation can be reduced.

DESCRIPTION OF EMBODIMENT

An embodiment of a traffic simulation system according to the present invention will be described below with reference to the drawings.

Figure 1:
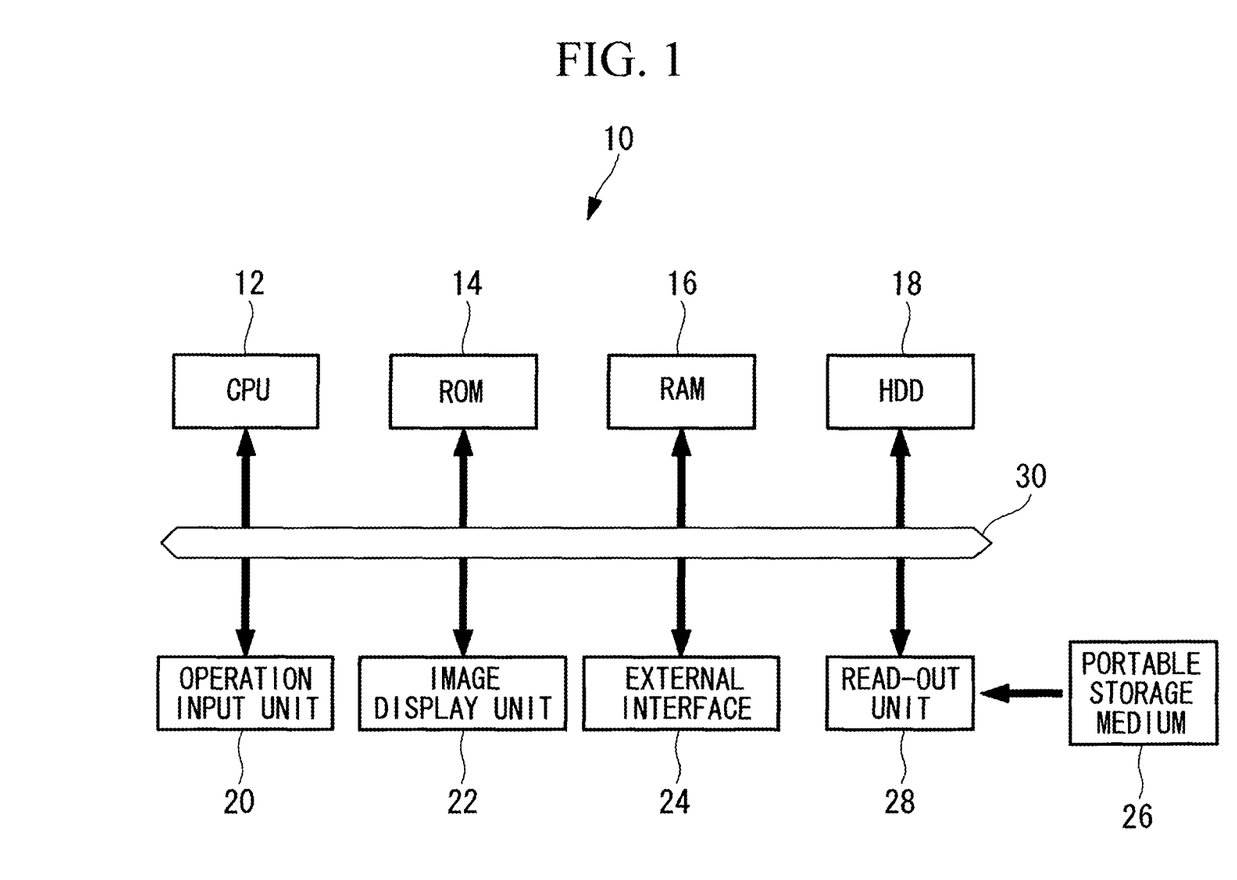
FIG. 1 is a diagram showing the configuration of the main portion of an electrical system of a traffic simulation system according to an embodiment of the present invention.

FIG. 1 shows the configuration of the main portion of an electrical system of a traffic simulation system 10 according to this embodiment.

The traffic simulation system 10 according to this embodiment is a system for executing a traffic simulation in which a vehicle model, which simulates a vehicle, is moved in a road system model (see FIG. 2) that simulates a road system (road network) including a plurality of roads and intersections that connect roads. Then, the traffic simulation system 10 is employed for, for example, in the event of a disaster occurring, when residents are traveling by using vehicles, deriving the time required to reach destinations unaffected by the disaster and deriving a distance that can be traveled within a predetermined period of time after the disaster has occurred, or for simulating the crowdedness of roads in residential areas, business areas, etc., and so on.

In the following description, the term roads means roads without a limitation on the number of lanes, and, furthermore, includes any roads, such as paved roads, unpaved roads, national roads, prefectural roads, private roads, and so forth; the term vehicles means motorcycles and various types of automobiles with three wheels or more, such as regular automobiles, buses, trucks, and so on, as well as any vehicles that travel on roads, such as, bicycles, pulled rickshaws, horse-drawn vehicles, and so forth.

The traffic simulation system 10 is provided with a CPU (Central Processing Unit) 12 that governs operation of the traffic simulation system 10 as a whole; a ROM (Read Only Memory) 14 in which various programs, various parameters, and so forth are stored in advance; a RAM (Random Access Memory) 16 that is employed as a work area, etc. during execution of various programs by the CPU 12; and an HDD (Hard Disk Drive) 18 serving as a storing unit for storing various information and various programs, such as the traffic simulation program, details of which will be described later.

Furthermore, the traffic simulation system 10 is provided with an operation input unit 20 that is configured including a keyboard, a mouse, and so forth and that receives inputs for various operations; an image display unit 22 that displays various images, such as an image that prompts input of various information required for the traffic simulation, an image that indicates results of the traffic simulation, and so forth; an external interface 24 that is connected with external devices, such as a printer, other computers, and so forth, and that sends/receives various information to/from the external devices; and a read-out unit 28 for reading out information stored in a portable storage medium 26. The portable storage medium 26 includes optical disks, such as a magnetic disk, CD (Compact Disc), DVD (Digital Versatile Disc), etc., IC (Integrated Circuit) memory cards, memory cards, and so forth.

The CPU 12, the ROM 14, the RAM 16, the HDD 18, the operation input unit 20, the image display unit 22, the external interface 24, and the read-out unit 28 are electrically connected with each other via a system bus 30. Therefore, the CPU 12 can individually perform accessing the ROM 14, the RAM 16, and the HDD 18, ascertaining the state of an operation at the operation input unit 20, displaying various images at the image display unit 22, sending/receiving various information to/from the external devices described above via the external interface 24, reading out information from the portable storage medium 26 via the read-out unit 28, and so on.

Figure 2:
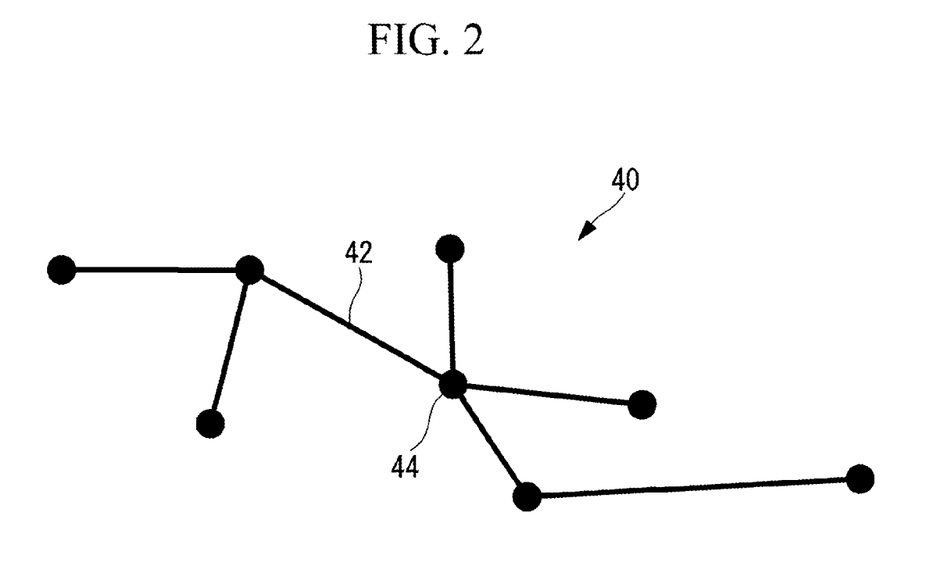
FIG. 2 is a schematic diagram showing a road system model in a traffic simulation according to the embodiment of the present invention.

FIG. 2 shows a schematic diagram of a road system model 40 in the traffic simulation according to this embodiment.

The road system model 40 includes links 42 that simulate the smallest sections of roads divided by intersections, etc. and nodes 44 that simulate intersections and turning points of roads, etc. The road system model 40 may simulate a real road system or it may simulate a fictitious road system. Numbers are individually assigned to the individual links 42 and the individual nodes 44, and the individual links 42 and the individual nodes 44 are distinguished on the basis of the assigned numbers (the numbers assigned to the individual links 42 and the individual nodes 44 are omitted in FIG. 2).

The presence/absence of traffic light models that simulate traffic lights for vehicles is preset for the individual nodes 44. The traffic light models change from green to red at predetermined time intervals. When the traffic light models are green, the vehicle models are allowed to travel from the links 42 to other links 42 via the nodes 44 where the traffic light models are installed, whereas, when the traffic light models are red, the vehicle models are prohibited from traveling from the links 42 to the other links 42 via the nodes 44 where the traffic light models are installed.

Figure 3A:
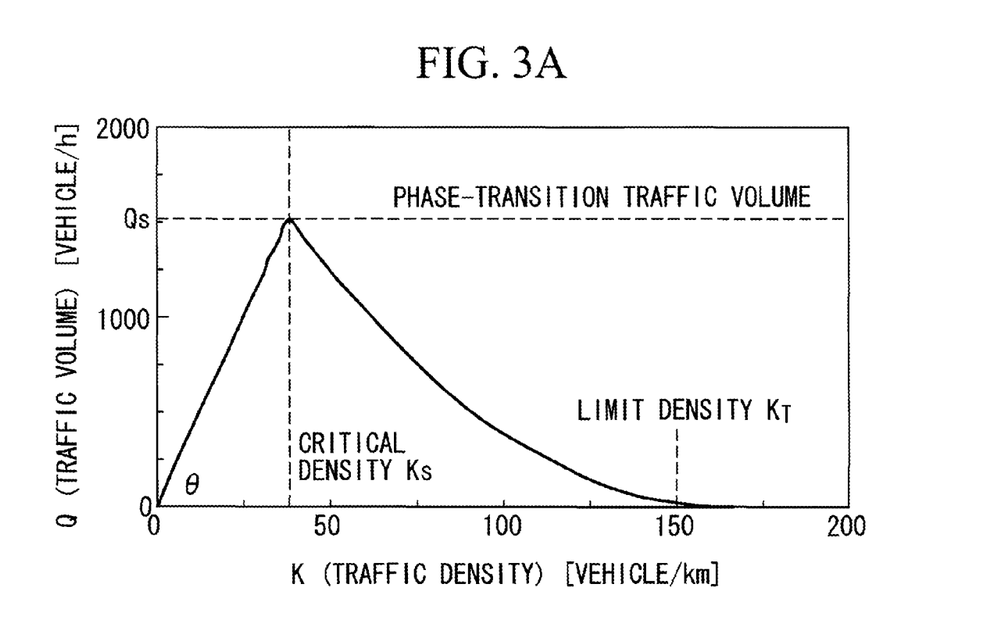
FIG. 3A is a graph showing the relationship between traffic density and traffic volume.
Figure 3B:
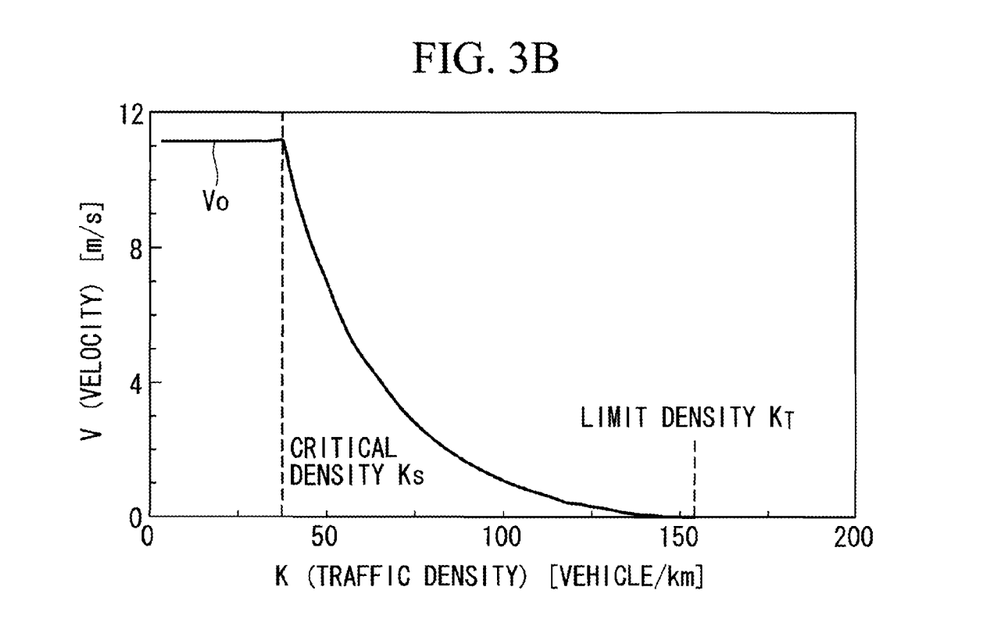
FIG. 3B is a graph showing the relationship between traffic density and vehicle velocity

Here, an example of the relationship between traffic density K (vehicle/km), which is the number of vehicles per unit distance, and traffic volume Q (vehicle/hour), which is the number of vehicles that pass in a given time, is shown in FIG. 3A. In addition, an example of the relationship between the traffic density K (vehicle/km) and vehicle velocity V (m/s) is shown in FIG. 3B.

Although the traffic volume Q increases with an increase in the traffic density K, as shown in FIG. 3A, the traffic volume Q shows a declining trend once the traffic density K reaches a certain value. When the traffic density K increases further, the traffic volume Q reaches 0, that is the velocities of vehicles traveling on roads reach 0, as shown in FIG. 3B. The value at which the traffic volume Q switches from increasing to decreasing is referred to as a phase-transition traffic volume $Q_S$; the traffic density K corresponding to the phase-transition traffic volume $Q_S$ is referred to as a critical density $K_S$; and the traffic density K where the traffic volume reaches 0 due to an increase in the traffic density K is referred to as a limit density $K_T$.

Then, the relationship between the traffic volume Q and the traffic density K after the phase-transition traffic volume $Q_S$ has been reached is expressed by, for example, the following expression (1) (Q–K curve), which is an approximation expression. In the expression (1), a, b, and c are constants.

{Eq. 1}

$$Q = aK^2 - bK + c \quad (1)$$

Expression (1) is predetermined for each link 42 on the basis of the road width, the number of lanes, the speed limit, etc. simulated by the link 42.

In addition, the vehicle velocity V shown in FIG. 3B is determined by dividing the traffic volume Q by the traffic density K, as indicated by the following expression (2).

{Eq. 2}

$$V = \frac{Q}{K} \quad (2)$$

Specifically, FIG. 3B shows that vehicles are traveling at a constant velocity (predetermined velocity limit $V_0$ in this embodiment) until the traffic volume Q reaches the phase-transition traffic volume $Q_S$ shown in FIG. 3A.

In contrast, the vehicle velocity V after the traffic volume has reached the phase-transition traffic volume $Q_S$ is expressed by the following expression (3).

{Eq. 3}

$$V = \frac{Q}{K} = aK - b + \frac{C}{K} \quad (3)$$

Here, conventional traffic simulations will be described. In the conventional traffic simulations, traffic simulations known as macroscopic methods and microscopic methods have been performed.

In the traffic simulations known as the macroscopic methods, the amounts of time required for the vehicle models to pass through the links 42 are calculated from the traffic volume Q of the vehicle models that enter the road system model 40 and the phase-transition traffic volume $Q_S$ thereof. Specifically, because computations are performed by assuming that the traffic densities, which are the densities of the vehicle models in the links 42, are uniform, the computations are simplified, and the time required for the traffic simulation can be short even if the road system model 40 is intended for a large area. In addition, with the macroscopic methods, because the computations are not performed separately for the individual vehicle models, the time required for the traffic simulation can be short even if the number of the vehicle models that enter the road system model 40 is increased.

However, with the macroscopic methods, because the traffic simulation is performed by assuming that the traffic densities in the links 42 are uniform, the traffic densities at the front of the links 42 increase/decrease with an increase/decrease in the traffic density at the rear thereof, such that the velocities of the vehicle models at the front increase/decrease due to the influences of the vehicle models in the rear, which makes the simulation contradictory to a general vehicle traffic in reality. In other words, the divergence of the traffic simulation results from reality is sometimes increased.

In contrast, with the traffic simulations known as the microscopic methods in the conventional traffic simulations, the behaviors of the vehicle models traveling in the road system model 40 are simulated in accordance with situations (velocities of the vehicle models in front, etc.) in which the individual vehicle models are placed. Because of this, the results of the traffic simulations by the microscopic methods are not contradictory to the general vehicle traffic in reality, and the divergence from reality is small as compared with the results of traffic simulations by the macroscopic methods.

However, with the microscopic methods, because the traffic simulations are separately performed for the individual vehicle models, the amount of computation is large as compared with the macroscopic methods, and, in particular, when the road system model 40 is intended for a wide area or when the number of vehicle models intended for the simulations is increased, the computation time is increased as compared with the macroscopic methods.

Therefore, with the traffic simulation according to this embodiment, in order to decrease the divergence from reality and reduce the time required for the simulation, for a vehicle model that enters a different link 42 from a link 42 via a node 44 in the road system model 40, the velocity thereof after entering the different link 42 is calculated on the basis of the density of the vehicle models in the different link 42 after the vehicle model has entered the different link 42.

Next, the operation of the traffic simulation system 10 according to this embodiment will be described with reference to FIGS. 4A, 4B, and 5.

Figure 4A:
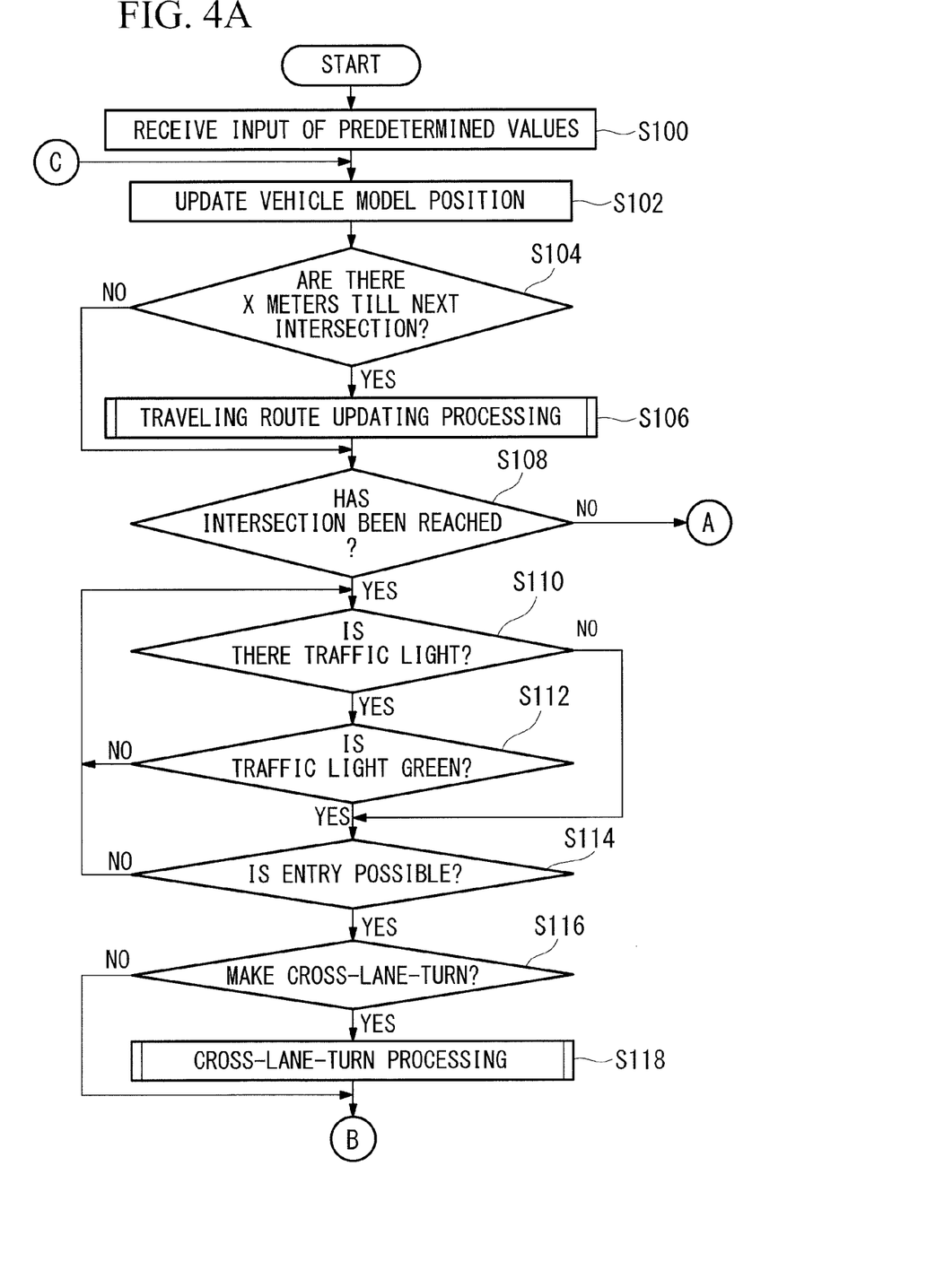
FIG. 4A is a flowchart showing the processing flow in a traffic simulation program according to the embodiment of the present invention.
Figure 4B:
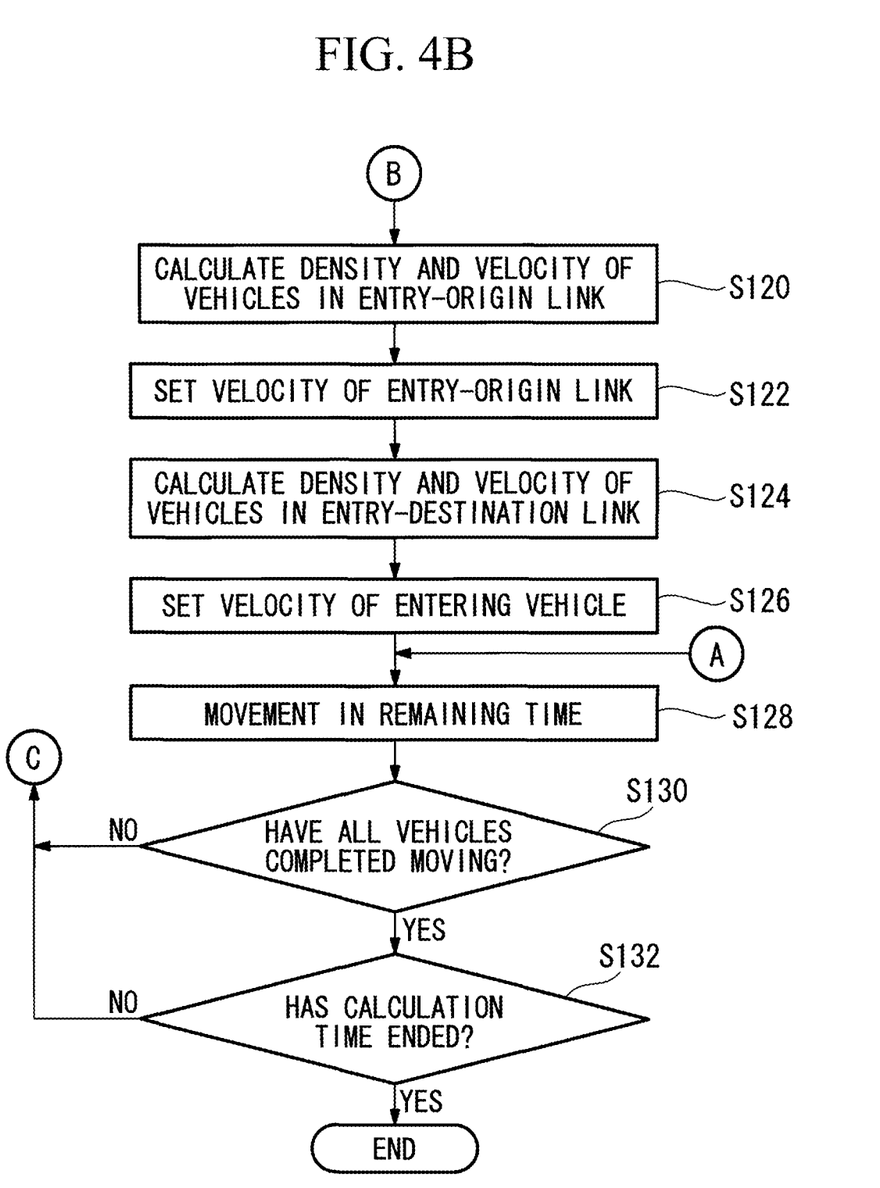
FIG. 4B is a flowchart showing the processing flow in the traffic simulation program according to the embodiment of the present invention.

FIGS. 4A and 4B are flowcharts showing the processing flows for a traffic simulation program executed by the CPU 12, and the traffic simulation program is stored in advance in a predetermined region of the HDD 18. In addition, with the traffic simulation according to this embodiment, steps 102 to 130 in the flowcharts shown in FIGS. 4A and 4B are executed at predetermined time intervals (for example, every second, every ten seconds, and so on).

First, in step 100, inputs of predetermined values for performing the traffic simulation according to this embodiment are received via the operation input unit 20.

The above-described predetermined values are various items of information required for performing the traffic simulation, such as the above-described time interval, the number of vehicle models to be moved in the road system model 40, movement starting positions for the individual vehicle models, destinations of the individual vehicle models, initial velocities of the individual vehicle models, accelerations of the individual vehicle models, the time for which the traffic simulation is executed (it is not time in reality but virtual time in the traffic simulation, which will be hereinafter referred to as "calculation time"), and so forth. When the inputting of predetermined values is completed, the process advances to the next step 102. Once the movement starting positions and the destinations are input for the vehicle models, route selection processing in which routes from the movement starting positions to the destinations are selected for the individual vehicles is executed. The details of the route selection processing will be described later.

In step 102 that follows, positions of the individual vehicle models in the road system model 40 are updated on the basis of the values input in step 100.

In step 104 that follows, it is judged whether or not the vehicle model is separated from the next intersection (node 44) for entering a different road (different link 42, which will be hereinafter referred to as an "entry-destination link") from a current road by a predetermined distance X (m) or greater; and the process advances to step 106 in the case of an affirmative judgment, whereas the process advances to step 108 in the case of a negative judgment.

In step 106, by executing the route selection processing for the vehicle models, the traveling routes of the vehicle models are updated. Accordingly, the traveling routes are updated to ones that are optimal at this point.

In step 108 in contrast, it is judged whether or not the vehicle model has reached the node 44, predetermined depending on the traveling route, for entering the entry-destination link; and the process advances to step 110 in the case of an affirmative judgment, whereas the process advances to step 128 in the case of a negative judgment.

In the following description, the vehicle model entering the different link 42 is referred to as an entering vehicle model. In addition, the link 42 in which the entering vehicle model was located before entering the entry-destination link is referred to as an entry-origin link.

In step 110, it is judged whether or not a traffic light model is installed at the node 44 which the entering vehicle model has reached; and the process advances to step 112 in the case of an affirmative judgment, whereas the process advances to step 114 in the case of a negative judgment.

In step 112, it is judged whether or not the traffic light model is showing green; and the process advances to step 114 in the case of an affirmative judgment, whereas, in the case of a negative judgment, a stand-by state is set until the traffic light model shows green.

In step 114, it is judged whether or not the entering vehicle model can enter the entry-destination link to which the node 44 is connected; and the process advances to step 116 in the case of an affirmative judgment, whereas the process returns to step 110 in the case of a negative judgment. The case in which step 114 results in a negative judgment is a case in which the vehicle models are positioned up to the rear end of the entry-destination link, thus making it impossible for the entering vehicle model to enter the entry-destination link via the node 44.

In step 116, it is judged whether or not the entering vehicle model needs to make a cross-lane-turn in order to enter the entry-destination link via the node 44; and the process advances to step 118 in the case of an affirmative judgment, where cross-lane-turn processing, described later, is executed, whereas the process advances to step 120 in the case of a negative judgment.

In step 120, a traffic density and vehicle velocities for the entry-origin link in which the entering vehicle model was located before entering the entry-destination link are calculated.

In step 122 that follows, the velocities of the vehicle models in the entry-origin link are set in accordance with the velocities calculated in step 120.

Figure 5A:
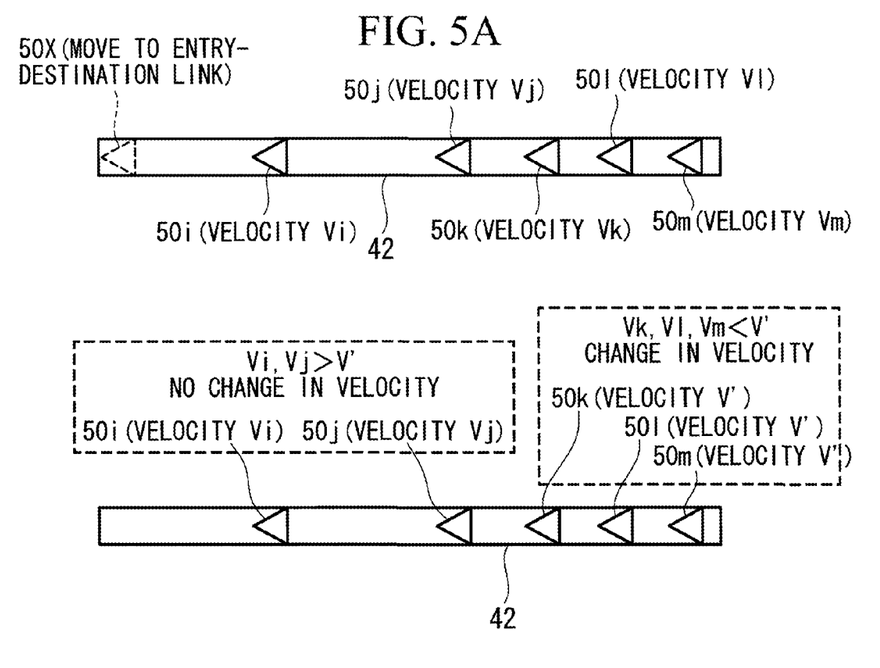
FIG. 5A is a schematic diagram needed for explaining changes in velocity of a vehicle model positioned at links before and after the vehicle model enters a link in the road system model according to the embodiment of the present invention.

FIG. 5A shows changes in velocities of vehicle models 50$i$ to 50$m$ positioned in the entry-origin link before and after the entering vehicle model moves from the entry-origin link.

The traffic density in the entry-origin link changes (decreases) due to the movement of an entering vehicle model 50X. Then, the velocities used for updating the velocities of the vehicle models 50$i$ to 50$m$ are calculated from the traffic density after the entering vehicle model has moved.

Specifically, from the above-described expression (2) or expression (3), velocity V' in accordance with the traffic density after the entering vehicle model 50X has moved is calculated. Then, in the example shown in FIG. 5A, because velocities Vk to Vm of the vehicle models 50$k$ to 50$m$ are lower than the velocity V' (the movement of the entering vehicle model 50X from the entry-origin link causes a reduction in vehicle model density in the entry-origin link, that is, causes an increase in velocity therein), the velocities of the vehicle models 50$k$ to 50$m$ are updated and set to the velocity V'. In contrast, because the velocities Vi and Vj for the vehicle models 50$i$ and 50$j$ are greater than the velocity V', their velocities are not updated.

Because the velocities of the vehicle models in the entry-origin link are calculated in this way in accordance with an increase/decrease in vehicle model density, as compared with conventional simulations (microscopic methods in particular), the time required for calculating the velocities of vehicle models in the entry-origin links is reduced.

In step 124 that follows, a traffic density and a vehicle model velocity V" for the entry-destination link after the entering vehicle model has entered are calculated.

In step 126 that follows, the velocity of the entering vehicle model after entering the entry-destination link is set in accordance with the velocity calculated in step 124.

Figure 5B:
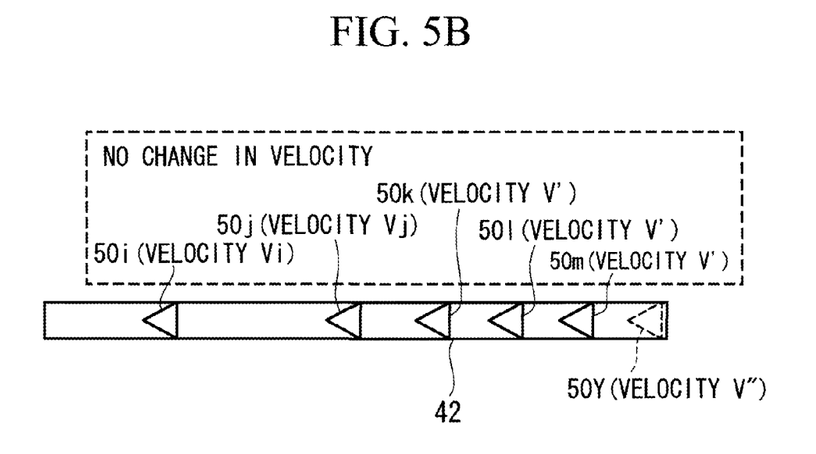
FIG. 5B is a schematic diagram needed for explaining changes in velocity of the vehicle model positioned at the links before and after the vehicle model enters the link in the road system model according to the embodiment of the present invention.

FIG. 5B shows changes in velocities of the vehicle models 50$i$ to 50$m$ positioned in the entry-destination link after an entering vehicle model 50Y has entered the entry-destination link.

The velocity V'" in accordance with the traffic density after the entering vehicle model 50Y has moved is also calculated in the above-described step 124 from the above-described expression (2) or expression (3). Then, the velocity of the entering vehicle model 50Y that has entered the entry-destination link is set to the velocity V'". Because the changes in traffic density are, on the other hand, due to the influence of the entering vehicle model 50Y, which will be positioned at the rear end, the velocities of the vehicle models 50$i$ to 50$m$ ahead of the entering vehicle model 50Y in the traveling direction are not changed.

In step 128 that follows, amounts of movement of the vehicle models are calculated for the time remaining within the time interval received in step 100

In step 130 that follows, it is judged whether or not the movements of all vehicle models in the road system model 40 have been completed; and the process advances to step 132 in the case of an affirmative judgment, whereas the process returns to step 102 in the case of a negative judgment.

In step 132, it is judged whether or not the calculation time received in step 100 has ended; and this program is terminated in the case of an affirmative judgment, whereas the process returns to step 102 in the case of a negative judgment.

In this way, with the traffic simulation system 10 according to this embodiment, because the velocity of the entering vehicle model that enters the entry-destination link is calculated on the basis of the density of the vehicle models in the entry-destination link, instead of calculating it from the velocities of the individual vehicle models, as compared with conventional simulations (microscopic methods, in particular), the time required for calculating the velocity of the entering vehicle model is reduced. Furthermore, because the above-described calculated velocity is set only to the entering vehicle model, and the velocities of the other vehicle models positioned in the entry-destination link are not changed, as compared with conventional simulations (macroscopic methods, in particular), the divergence between reality and the simulation can be reduced. In addition, it is also possible to track the behaviors of the individual vehicle models, and it is possible to, for example, individually measure the time required for the vehicle models to reach the destinations from the movement starting positions.

Next, the route selection processing will be described with reference to FIGS. 6 and 7.

Figure 6:
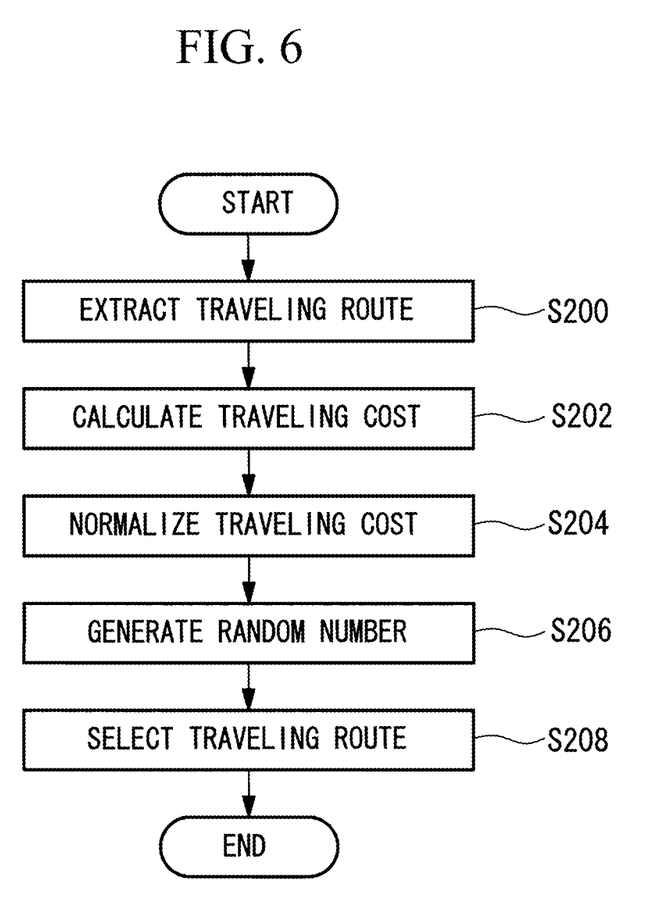
FIG. 6 is a flowchart showing the processing flow in a route selection program according to the embodiment of the present invention.
Figure 7:
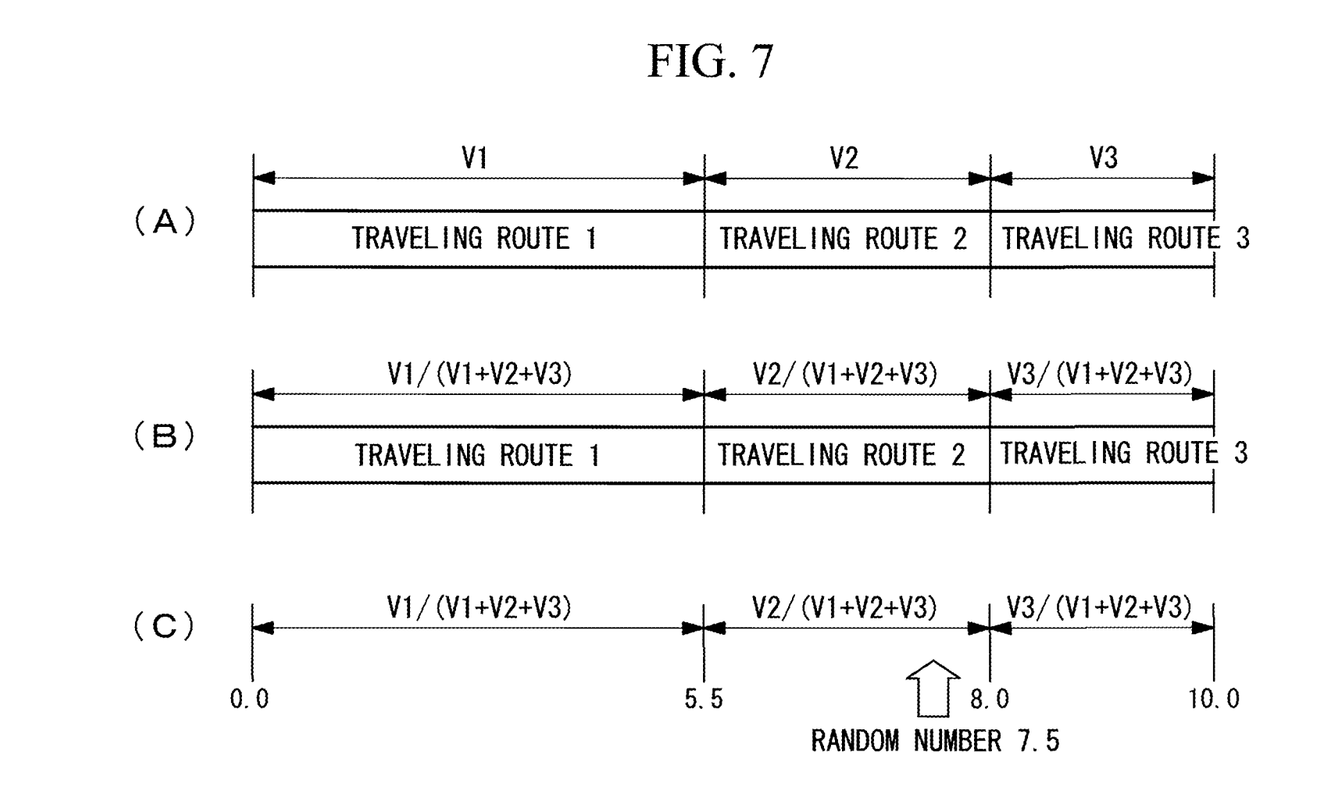
FIG. 7 is a schematic diagram needed for explaining selection of a traveling route in the route selection program according to the embodiment of the present invention.

FIG. 6 is a flowchart showing the processing flow of the route selection program executed by the CPU 12 when performing the route selection processing, and the route selection program is stored in advance in a predetermined region of the HDD 18.

First, in step 200, a plurality of traveling routes (three in the example in FIG. 7) for the vehicle models are extracted separately for the individual vehicle models based on the movement starting positions and the destinations of the vehicle models input in step 100 of the traffic simulation program. The plurality of traveling routes to be extracted are selected, for example, in the order of increasing traveling distance of the route from the movement starting positions of the vehicle models to their destinations, starting from the shortest.

In step 202 that follows, traveling costs are calculated for the individual traveling routes based on the traveling routes extracted in step 200. The traveling costs include, the time required for the vehicle models to reach the destinations via the extracted traveling routes, velocities (average velocity and maximum velocity) thereof, and so forth.

FIG. 7(A) shows the traveling costs for the individual traveling routes. In the example of FIG. 7(A), average velocities of the vehicle models for the individual traveling routes are used as the traveling costs, where the average velocity of a vehicle model traveling on the traveling route 1 is a velocity $V_1$, the average velocity of a vehicle model traveling on the traveling route 2 is a velocity $V_2$, and the average velocity of a vehicle model traveling on the traveling route 3 is a velocity $V_3$. The individual velocities have a relationship such that velocity $V_1$>velocity $V_2$>velocity $V_3$.

In step 204 that follows, the traveling costs for the individual traveling routes calculated in step 202 are normalized. In the example in FIG. 7(B), the traveling costs of the individual traveling routes are normalized by the sum of the average velocities of the vehicle models for the individual traveling routes.

Then, the traveling costs of the individual traveling routes are divided into predetermined value ranges (for example, a proportional distribution) in accordance with the levels of the normalized traveling costs. For example, the predetermined value range described above is assumed to be 0 to 10, and divisions are made such that the normalized traveling cost for the traveling route 1 is 0 to 5.5, the normalized traveling cost for the traveling route 2 is 5.6 to 8.0, and the normalized traveling cost for the traveling route 3 is 8.1 to 10.0.

In step 206 that follows, a random number is generated. In this embodiment, the random number to be generated is a value in the above-described value range.

In step 208 that follows, the traveling route having the traveling cost corresponding to the random number generated in step 206 is determined to be the traveling route for the vehicle model.

In the example in FIG. 7(C), because the value of the generated random number is 7.5, the traveling route 2 is selected as the traveling route. Then, this program is terminated after determining the traveling route, and the traveling routes are set for the individual vehicle models.

Next, the cross-lane-turn processing will be described with reference to FIG. 8.

Figure 8:
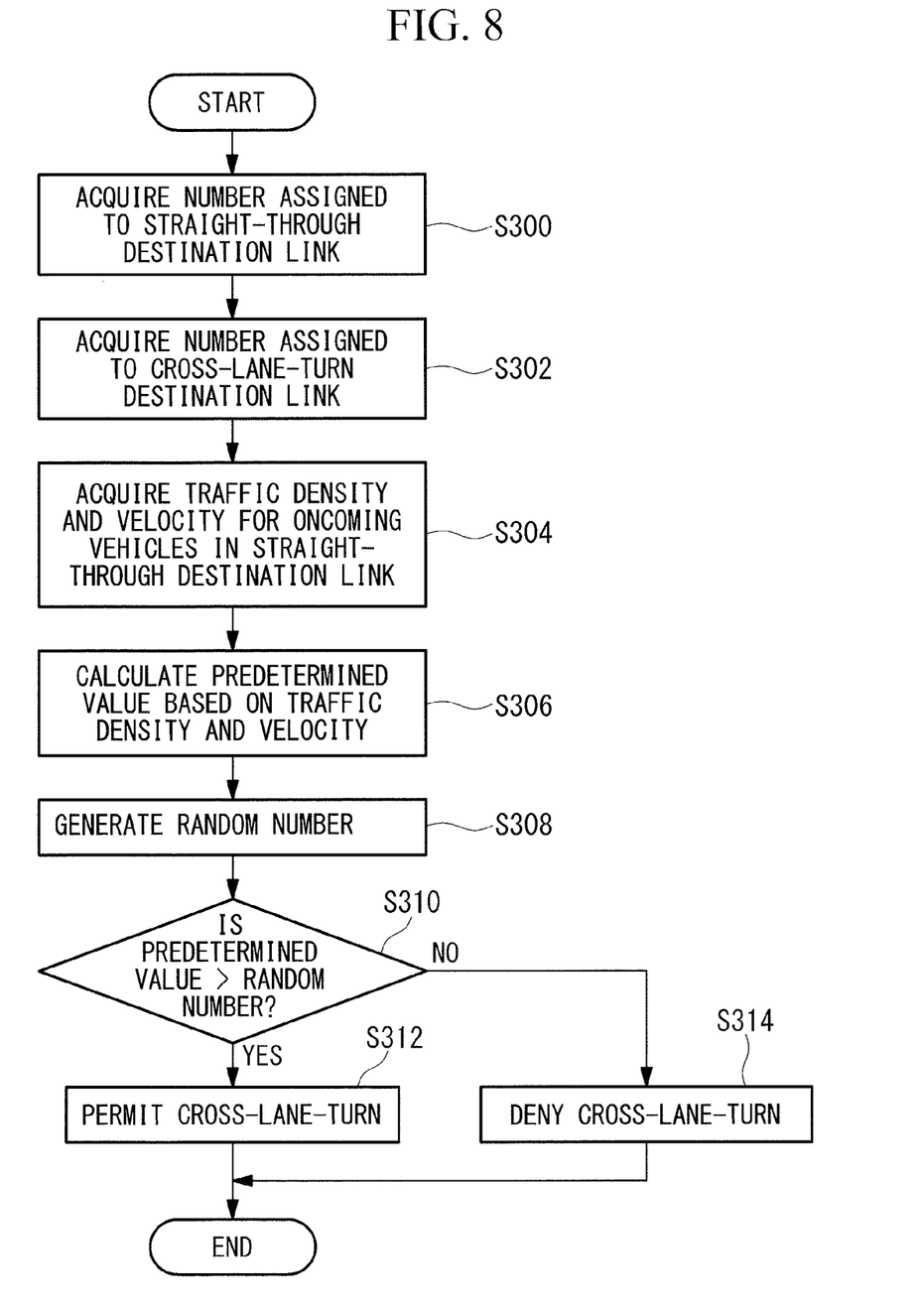
FIG. 8 is a flowchart showing the processing flow in a cross-lane-turn possibility determination program according to the embodiment of the present invention.

FIG. 8 is a flowchart showing the processing flow in a cross-lane-turn possibility determining program executed by the CPU 12 in the case of performing the cross-lane-turn processing, and the cross-lane-turn possibility determining program is stored in advance in a predetermined region of the HDD 18.

First, in step 300, the number assigned to a straight-through destination link 42, at which the entering vehicle model moves straight through without making a cross-lane-turn, is acquired.

Figure 9:
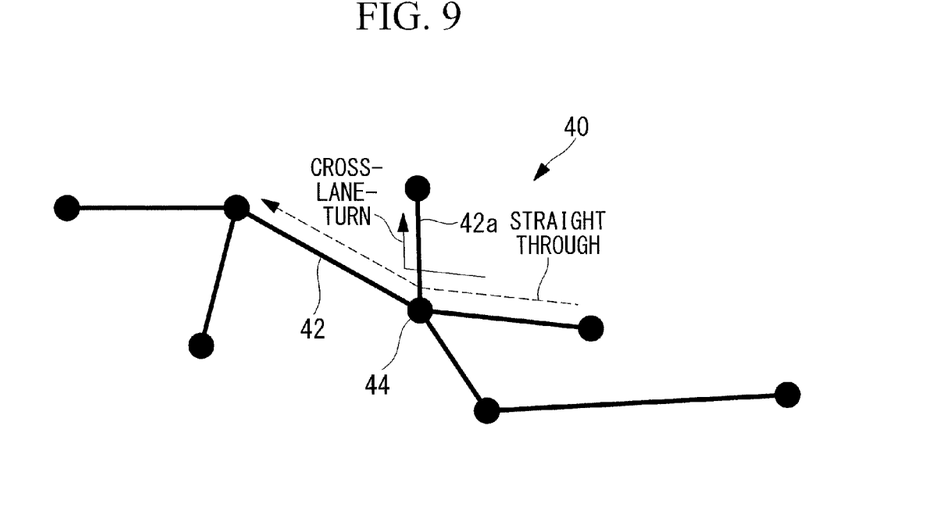
FIG. 9 is a schematic diagram of the road system model needed for explaining the cross-lane-turn possibility for an entering vehicle according to the embodiment of the present invention.

In step 302 that follows, the number assigned to a cross-lane-turn destination link 42 (entry-destination link 42a in the example shown in the schematic diagram in FIG. 9), into which the entering vehicle model makes a cross-lane-turn, is acquired.

In step 304 that follows, the traffic density K and the velocity V are acquired for the vehicle models in the straight-through destination link 42 acquired in step 300. Specifically, the traffic density K and the velocities V are acquired for the vehicle models that act as oncoming vehicles in the link 42 where the entering vehicle model is positioned.

In step 306 that follows, a predetermined value P for determining the possibility for the entering vehicle to make the cross-lane-turn is calculated on the basis of the traffic density K and the velocity V acquired in step 300.

In this embodiment, as shown in the following expression (4), the above-described predetermined value (probability value) P is calculated by inputting a distribution D (Distribution), the velocity V, and an interval I (Interval) to a predetermined function f.

{Eq. 4}

$$P = f(D, V, I), D = \frac{1}{K}, V = \frac{Q}{K}, I = \frac{1}{Q} \qquad (4)$$

Expression (4) according to this embodiment is a function in which the predetermined value P takes a larger value when the traffic density K and the velocity V for the vehicle models that act as the oncoming vehicles for the entering vehicle model are lower.

In step 308 that follows, a random number is generated.

In step 310 that follows, the predetermined value P calculated in step 306 and the value of the random number generated in step 308 are compared; it is judged whether or not the predetermined value P is larger than the value of the random number; and the process advances to step 312 in the case of an affirmative judgment, whereas the process advances to step 314 in the case of a negative judgment.

In step 312, a cross-lane-turn permission flag that permits the entering vehicle model to make a cross-lane-turn into the entry-destination link 42a is set, and this program is terminated. Specifically, with lower traffic density K and velocity V for the vehicle models that act as the oncoming vehicles for the entering vehicle model, the entering vehicle model makes the cross-lane-turn more easily (probability for the cross-lane-turn permission becomes higher), and, with higher traffic density K and velocity V for the vehicle models that act as the oncoming vehicles, the entering vehicle model makes the cross-lane-turn less easily (probability for the cross-lane-turn permission becomes lower). Once the cross-lane-turn permission flag is set, the traffic simulation causes the entering vehicle model to make a cross-lane-turn into the entry-destination link 42a.

In step 314, because the entering vehicle model is not permitted to make a cross-lane-turn into the entry-destination link 42a, this program is terminated without setting the cross-lane-turn permission flag.

In this way, because the possibility for the entering vehicle model to make a cross-lane-turn is determined on the basis of the traffic density and velocity of the vehicle models that act as the oncoming vehicles on the road where the entering vehicle model is positioned, the divergence between reality and the simulation can be reduced for the case in which the entering vehicle model makes a cross-lane-turn. In addition, because the possibility of making a cross-lane-turn is determined by using a random number, processing for determining the possibility of making a cross-lane-turn can be simplified.

As above, although the present invention has been described in terms of the above-described embodiment, the technical scope of the present invention is not limited to the scope described in the above-described embodiment. Various alterations or improvements can be made in the above-described embodiment within a range that does not depart from the spirit of the present invention, and the technical scope of the present invention also encompasses forms to which these alterations or the improvements are made.

For example, although the traffic simulation program is stored in the HDD 18 in the above-described embodiment, the present invention is not limited thereto, and a form in which the traffic simulation program is stored in the portable storage medium 26 may be employed.

In addition, although the processing of the traffic simulation program in the above-described embodiment includes the traveling-route selection processing and the cross-lane-turn processing, the present invention is not limited thereto, and a form in which at least one of the traveling-route selection processing and the cross-lane-turn processing is not included may be employed.

In addition, although the relationship between the traffic volume Q and the traffic density K in the above-described embodiment is expressed by a quadratic approximation expression, as indicated by expression (1), as an example, the present invention is not limited thereto, and the relationship between the traffic volume Q and the traffic density K may be expressed by a linear polynomial approximation, a cubic or higher polynomial approximation, or other approximation expression.

In addition, although the function shown in expression (4) in the above-described embodiment is described for the case in which it is assumed to be a function where the value of the predetermined value P increases with decreases in the traffic density K and the velocity V for the vehicle models that act as the oncoming vehicles, the present invention is not limited thereto, and the function shown in expression (4) may be a function where the value of the predetermined value P decreases with decreases in the traffic density K and the velocity V for the vehicle models that act as the oncoming vehicles. In the case of this form, the entering vehicle model is permitted to make a cross-lane-turn if the predetermined value P is smaller when the predetermined value P and the value of the random number are compared.

In addition, although the traffic light models in the above-described embodiment are described as traffic lights that change between green and red, the present invention is not limited thereto, and the traffic light models may be traffic lights that change between green, yellow, and red. In the case of this form, simulations with an even smaller divergence from reality can be performed by performing processing that changes the velocities of the vehicle models that travel in front of the traffic light models when the traffic light models change from green to yellow.

Furthermore, although vehicles in the traffic simulation in this embodiment are described as various vehicles, such as regular automobiles or the like with three wheels or more, the present invention is not limited thereto, and a form in which airport runways are assumed as the roads and airplanes moving on the runways are assumed as the vehicles may be employed. By doing so, it is possible to simulate a state of crowdedness for airplanes on runways with the traffic simulation system 10. In the case of this form, the traffic light models correspond to instructions to the airplanes from traffic controllers.

REFERENCE SIGNS LIST 10 traffic simulation system
40 road system model
42 link
44 node

The invention claimed is:

1. A traffic simulation system in which vehicle models, which simulate vehicles, are moved in a road system model that simulates a road system including a plurality of roads and intersections that connect the roads, the traffic simulation system comprising:
    a memory; and
    a processor configured to function as
    an entering vehicle model presence judging unit for judging a presence or an absence of an entering vehicle model, which is a vehicle model that enters from a road in the road system model to a different road thereof via an intersection;
    a calculating unit for calculating a velocity after entering the different road for the entering vehicle model that has been judged by the entering vehicle model presence judging unit to be entering the different road on a basis of a density of the vehicle models in the different road after the entering vehicle model has entered the different road; and
    a setting unit that only sets the velocity calculated by the calculating unit for the entering vehicle model that has entered the different road, the setting unit does not change the velocity of other vehicle models travelling the different road ahead of the entering vehicle model in the travelling direction of the different road,
    an entry-origin-velocity calculating unit for calculating velocities of the vehicle models in an entry-origin road for the entering vehicle model after the entering vehicle model has entered the different road, on a basis of density of the vehicle models in the entry-origin road; and
    an entry-origin-velocity setting unit for comparing the entry-origin-velocity calculated by the entry-origin-velocity calculating unit with the velocity of each of the vehicle models in the entry-origin road before the entering vehicle model has entered the different road, and for setting the velocity of each of the vehicle models in the entry-origin road after the entering vehicle model has entered the different road on the basis of a result of the comparisons.

2. The traffic simulation system according to claim 1, the processor further configured to function as:
    a cross-lane-turn judging unit for judging, when the entering vehicle model presence judging unit judges that there is an entering vehicle model, whether or not the entering vehicle model is a cross-lane-turning vehicle which makes a cross-lane-turn in order to enter the different road; and a determining unit for determining, when the cross-lane-turn judging unit judges that the entering vehicle model is a cross-lane-turning vehicle, a possibility for the entering vehicle model to make the cross-lane-turn on the basis of density and velocity of the vehicle models that act as oncoming vehicle models in the road where the entering vehicle model is positioned.

3. The traffic simulation system according to claim 2, the processor further configured to function as a random-number generating unit for generating a random number, wherein the determining unit permits the entering vehicle model to make a cross-lane-turn on the basis of a result of comparisons between a value of the random number generated by the random-number generating unit and a value based on the density and the velocity of the vehicle models that act as the oncoming vehicles.

4. A non-transitory storage medium readable by a computer and storing a traffic simulation program employed in a traffic simulation system in which vehicle models, which simulate vehicles, are moved in a road system model that simulates a road system including a plurality of roads and intersections that connect the roads, the program when executed causes the computer to function as an entering vehicle model presence judging unit for judging a presence or an absence of an entering vehicle model, which is a vehicle model that enters from a road in the road system model to a different road thereof via an intersection;

a calculating unit for calculating a velocity after entering the different road for the entering vehicle model that has been judged by the entering vehicle model presence judging unit to be entering the different road on the basis of a density of the vehicle models in the different road after the entering vehicle model has entered the different road; and a setting unit for setting the velocity calculated by the calculating unit only for the entering vehicle model that has entered the different road, and for leaving the velocity of other vehicle model ahead of the entering vehicle model in the traveling direction in the different road unchanged, further comprising:

an entry-origin-velocity calculating unit for calculating velocities of the vehicle models in an entry-origin road for the entering vehicle model after the entering vehicle model has entered the different road, on a basis of density of the vehicle models in the entry-origin road; and an entry-origin-velocity setting unit for comparing the entry-origin-velocity calculated by the entry-origin-velocity calculating unit with the velocity of each of the vehicle models in the entry-origin road before the entering vehicle model has entered the different road, and for setting the velocity of each of the vehicle models in the entry-origin road after the entering vehicle model has entered the different road on a basis of the result of the comparisons.

* * * * *